United States Patent
Hu

(10) Patent No.: US 12,136,878 B2
(45) Date of Patent: Nov. 5, 2024

(54) REGULATOR CIRCUIT AND MULTI-STAGE AMPLIFIER CIRCUIT

(71) Applicant: Richtek Technology Corporation, Zhubei (TW)

(72) Inventor: Min-Hung Hu, New Taipei (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 297 days.

(21) Appl. No.: 17/933,877

(22) Filed: Sep. 21, 2022

(65) Prior Publication Data

US 2023/0216401 A1 Jul. 6, 2023

(30) Foreign Application Priority Data

Jan. 4, 2022 (TW) .................................. 111100308

(51) Int. Cl.
*H02M 3/155* (2006.01)
*H03F 3/16* (2006.01)

(52) U.S. Cl.
CPC .............. *H02M 3/155* (2013.01); *H03F 3/16* (2013.01)

(58) Field of Classification Search
CPC .................................. H02M 3/155; H03F 3/16
See application file for complete search history.

(56) References Cited

U.S. PATENT DOCUMENTS

2022/0116002 A1* 4/2022 Hu ...................... H03F 3/45991
2023/0198473 A1* 6/2023 Yu ............................ H03F 1/42
330/76

* cited by examiner

*Primary Examiner* — Jue Zhang
*Assistant Examiner* — Lakaisha Jackson
(74) *Attorney, Agent, or Firm* — Tung & Associates

(57) ABSTRACT

A multi-stage amplifier circuit includes: a front stage amplification circuit, for generating a front stage amplification signal according to a difference between a primary reference signal and a primary feedback signal; an output adjustment circuit, for generating a driving signal according to the front stage amplification signal; and an output transistor, controlled by the driving signal to generate an output signal. The output adjustment circuit includes: an adjustment transistor biased by a differential current of the front stage amplification signal; and an impedance adjustment device biased by the differential current. A resistance of the impedance adjustment device is determined by a difference between an adjustment feedback signal and an adjustment reference signal. The driving signal is determined by a product of a resistance of the impedance adjustment device multiplied by the differential current of the front stage amplification signal, and a drain-source voltage of the adjustment transistor.

18 Claims, 14 Drawing Sheets

REGULATOR CIRCUIT AND MULTI-STAGE AMPLIFIER CIRCUIT

CROSS REFERENCE

The present invention claims priority to TW 111100308 filed on Jan. 4, 2022.

BACKGROUND OF THE INVENTION

Field of Invention

The present invention relates to a multi-stage amplifier circuit; particularly, it relates to a high speed multi-stage amplifier circuit having multiple loops. The present invention also relates to a regulator circuit equipped with the above-mentioned multi-stage amplifier circuit.

Description of Related Art

Please refer to FIG. 1, which shows a schematic diagram of a conventional multi-stage amplifier circuit 100. The conventional multi-stage amplifier circuit 100 includes a front stage amplification circuit 10 and an output stage circuit 20. The front stage amplification circuit 10 generates a front stage amplification signal EAO according to a difference between an input signal Vip and an input signal Vin. An output transistor MOH generates an output signal Vo according to the front stage amplification signal EAO generated by the front stage amplification circuit 10. When the relationship between the input signal Vip and the input signal Vin is in a steady state, the output transistor MOL mirrors a quiescent current of the front stage amplification circuit 10 to determine a quiescent current of the output stage circuit 20. On the other hand, when the relationship between the input signal Vip and the input signal Vin is in a transient state, the output transistor MOL can serve to amplify the current to a certain extent. The input signal Vin is for example correlated with the output signal Vo.

The prior art multi-stage amplifier circuit 100 shown in FIG. 1 has the following drawbacks that: in a case when the quiescent current is very low, the output transistor MOL cannot provide the required current sink function in the transient state, so an undesired voltage overshoot may occur. And, the output transistor MOL cannot effectively absorb the leakage current of the output transistor MOH, which also will cause the output voltage to be too high.

Please refer to FIG. 2, which shows a schematic diagram of another conventional multi-stage amplifier circuit. The conventional multi-stage amplifier circuit 200 includes a front stage amplification circuit 10 and an output stage circuit 20. The front stage amplification circuit 10 generates a front stage amplification signal EAO according to a difference between a feedback signal VFB and a reference signal VREF. The output stage circuit 20 controls an output transistor MOH and an output transistor MOL in the output stage circuit 20 according to the front stage amplification signal EAO, so as to generate an output signal Vo.

The output stage circuit 20 further includes an output adjustment circuit 25, which generates a driving signal VdrvL according to the front stage amplification signal EAO. The output transistor MOL is under control by the driving signal VdrvL to generate the output signal Vo. The feedback signal VFB is correlated with the output signal Vo. A gate-source voltage of the output transistor MOL is determined by the driving signal VdrvL, so as to determine an output current Io of the output signal Vo.

In this prior art multi-stage amplifier circuit 200, the output adjustment circuit 25 includes: an adjustment transistor MC14 and an impedance adjustment device MC7. The adjustment transistor MC14 is biased by a branch current of a differential transistor M6. The front stage amplification signal EAO controls a transistor M2 to generate a bias signal via a transistor MC12, thus adjusting a resistance of the impedance adjustment device MC7. In this embodiment, the capacitor CM is a Miller compensation capacitor for frequency compensation to enhance stability.

The prior art shown in FIG. 2 has the following drawbacks that: when an output voltage Vo is in a transient state, the difference between the feedback signal VFB and the reference signal VREF is large, so the front stage amplification signal EAO adjusts the resistance of the impedance adjustment device MC7 via the transistor M2 and the transistor M12, to adjust the driving signal VdrvL, so as to speed up adjusting the output current Io of the output signal Vo. However, because of the Miller compensation capacitor CM, the response of the front stage amplification signal EAO will become slow, whereby the transistor MC12, the transistor MC7, and the transistor MC14 cannot quickly respond to the transient variation of the output voltage Vo, and consequently the output transistor MOH and the output transistor MOL cannot quickly respond to the transient variation of the output voltage Vo.

As compared to the prior arts in FIG. 1 and FIG. 2, the present invention is advantageous in that: the multi-stage amplifier circuit of the present invention controls a bias current of the output transistor via another loop, whereby the loop bandwidth and response speed are significantly increased.

SUMMARY OF THE INVENTION

From one perspective, the present invention provides a multi-stage amplifier circuit, comprising: a front stage amplification circuit, which is configured to operably generate a front stage amplification signal according to a difference between a primary feedback signal and a primary reference signal; at least one output adjustment circuit, which is configured to operably generate a driving signal according to the front stage amplification signal; and at least one output transistor, which is under control by the driving signal to operably generate an output signal; wherein the primary feedback signal is correlated with the output signal, and wherein a gate-source voltage of the at least one output transistor is determined by the driving signal, so as to determine an output current of the output signal; wherein each of the at least one output adjustment circuit includes: an adjustment transistor, which is biased by a differential current of the front stage amplification signal; and an impedance adjustment circuit coupled to the adjustment transistor, wherein the impedance adjustment circuit includes: an impedance adjustment device, which is biased by the differential current of the front stage amplification signal, wherein a resistance of the impedance adjustment device is determined by a difference between an adjustment feedback signal and an adjustment reference signal, wherein the adjustment feedback signal is correlated with the output signal; wherein the driving signal is determined by a drain-source voltage of the adjustment transistor and a voltage across the impedance adjustment device, wherein the voltage across the impedance adjustment device is determined by a product of the resistance of the impedance adjustment device multiplied by the differential current of the front stage amplification signal.

In one embodiment, the impedance adjustment circuit further includes a transconductance amplifier circuit, which includes: a pair of differential transistors, which are configured to operably generate an adjustment signal according to the difference between the adjustment feedback signal and the adjustment reference signal; a transconductance transistor which functions as the impedance adjustment wherein a resistance of the transconductance transistor is adjusted according to the adjustment signal.

In one embodiment, a linear relationship lies between the resistance of the transconductance transistor and the difference between the adjustment feedback signal and the adjustment reference signal.

In one embodiment, in a case when the output signal is in a transient state, the transconductance transistor is biased to operate in a saturation region, so that the resistance of the transconductance transistor is adjusted according to the adjustment signal with a linear relationship therebetween.

In one embodiment, the transconductance transistor is connected in series to the adjustment transistor.

In one embodiment, the transconductance amplifier circuit is biased by a common mode current from the front stage amplification signal.

In one embodiment, the front stage amplification circuit is implemented as an operational amplifier, which is configured to operably generate at least one pair of transconductance currents complementary to each other according to the difference between the primary feedback signal and the primary reference signal, wherein the common mode current from the front stage amplification signal and the difference current of the front stage amplification signal are determined by the pair of transconductance currents.

In one embodiment, the adjustment transistor is coupled as a diode.

In one embodiment, a gate of the adjustment transistor is biased by the driving signal.

In one embodiment, the transconductance amplifier circuit further includes: a load transistor, which is coupled as a diode, wherein a current flowing through one of the pair of differential transistors is configured to operably bias the load transistor, so as to generate the adjustment signal.

In one embodiment, a bias value lies between an adjustment target value of the output adjustment circuit and an output target value of the front stage amplification circuit, so that when the output signal exceeds the output target value by a difference which is greater than the bias value, the output adjustment circuit controls the output transistor according to the adjustment target value, so that in a transient state, the output signal is regulated such that the output signal does not exceed a sum of output target value plus the bias value.

In one embodiment, the at least one output transistor includes: a first output transistor and a second output transistor, which have conduction types complementary to each other; wherein the at least one output adjustment circuit includes: a first output adjustment circuit and a second output adjustment circuit, which are configured to operably and respectively generate corresponding driving signals according to the front stage amplification signal, so as to respectively control the first output transistor and the second output transistor, thereby generating the output signal.

In one embodiment, a circuit configuration of the first output adjustment circuit and a circuit configuration of the second output adjustment circuit are complementary to each other, so that the driving signal of the first output adjustment circuit and the driving signal of the second output adjustment circuit are complementary to each other, whereby the first output transistor and the second output transistor generate the output signal in a push-pull fashion.

In one embodiment, the first output transistor, the second output transistor, the first output adjustment circuit and the second output adjustment circuit are implemented as a class AB output stage circuit.

In one embodiment, the multi-stage amplifier circuit is implemented as an operational amplifier.

In one embodiment, the multi-stage amplifier circuit further comprises: a compensation capacitor coupled between the front stage amplification signal and the output signal, wherein the compensation capacitor is configured to operably provide frequency compensation.

From another perspective, the present invention provides a regulator circuit, comprising: a multi-stage amplifier circuit according to the above; and a feedback circuit coupled to the output signal, wherein the feedback circuit is configured to operably generate a primary feedback signal and an adjustment feedback signal, whereby the multi-stage amplifier circuit regulates the output signal to an output target value.

In one embodiment, a bias value lies between an adjustment target value of the output adjustment circuit and an output target value of the front stage amplification circuit, so that when the output signal exceeds the output target value by a difference which is greater than the bias value, the output adjustment circuit controls the output transistor according to the adjustment target value, so that in a transient state, the output signal is regulated such that the output signal does not exceed a sum of output target value plus the bias value.

The objectives, technical details, features, and effects of the present invention will be better understood with regard to the detailed description of the embodiments below, with reference to the attached drawings.

BRIEF DESCRIPTION OF THE DRAWINGS

FIG. 4 shows a schematic diagram of an adjustment transistor in a multi-stage amplifier circuit according to an embodiment of the present invention, whereas.

FIG. 6 shows a schematic diagram of a multi-stage amplifier circuit which includes plural output transistors according to an embodiment of the present invention, whereas.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 3:
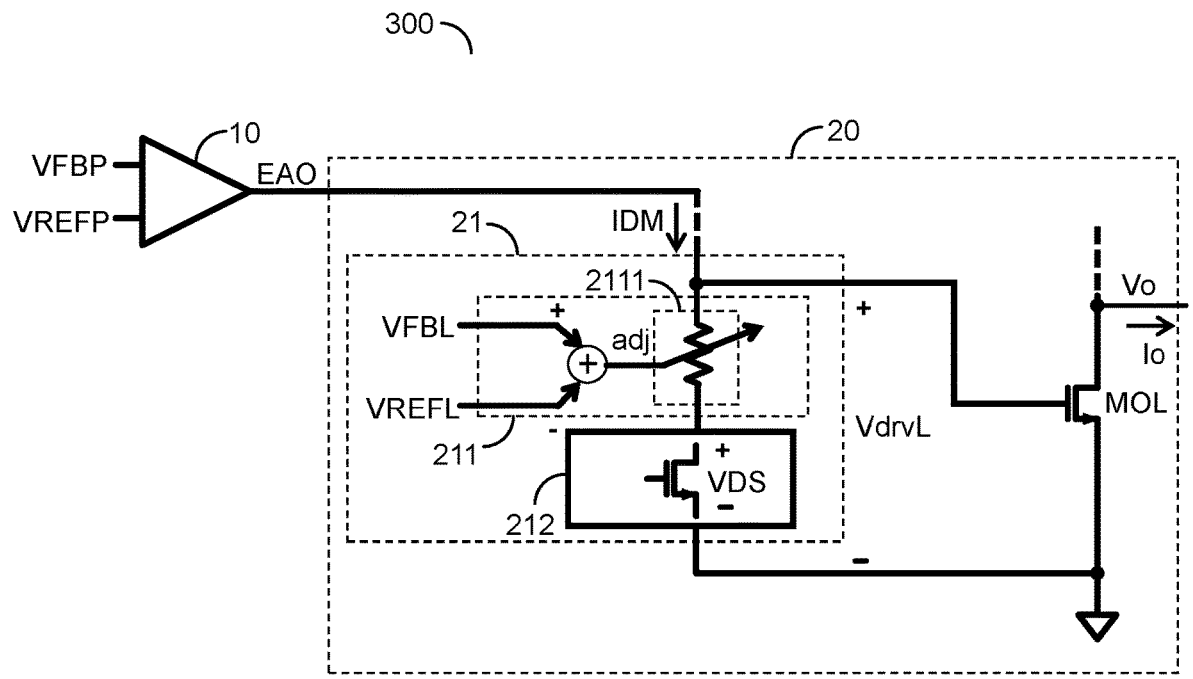
FIG. 3 shows a schematic circuit block diagram of a multi-stage amplifier circuit according to an embodiment of the present invention.

Please refer to FIG. 3, which shows a schematic circuit block diagram of a multi-stage amplifier circuit according to an embodiment of the present invention. The multi-stage amplifier circuit 300 of the present invention comprises: a front stage amplification circuit 10 and an output stage circuit 20. The front stage amplification circuit 10 is configured to operably generate a front stage amplification signal EAO according to a difference between a primary feedback signal VFBP and a primary reference signal VREFP. The output stage circuit 20 includes at least one output adjustment circuit (e.g., output adjustment circuit 21) and at least one output transistor (e.g., output transistor MOL). The output adjustment circuit 21 is configured to operably generate a driving signal VdrvL according to the front amplification signal EAO. The output transistor MOL is control by the driving signal VdrvL to generate an output signal Vo under.

The primary feedback signal VFBP is correlated with the output signal Vo. A gate-source voltage of the output transistor MOL is determined by the driving signal VdrvL, so as to determine an output current Io of the output signal Vo.

In one embodiment, the output adjustment circuit 21 includes: an adjustment transistor 212 and an impedance adjustment circuit 211. The adjustment transistor 212 is biased by a differential current IDM of the front stage amplification signal EAO, the details of which will be described later.

The impedance adjustment circuit 211 is coupled to the adjustment transistor 212. In one embodiment, the impedance adjustment circuit 211 includes: an impedance adjustment device 2111, which is biased by the differential current IDM of the front stage amplification signal EAO. In addition, as shown in FIG. 3, a resistance of the impedance adjustment device 2111 is determined by a difference between an adjustment feedback signal VFBL and an adjustment reference signal VREFL, wherein the adjustment feedback signal VFBL is correlated with the output signal Vo.

The driving signal VdrvL is determined by a drain-source voltage of the adjustment transistor 212 and a voltage across the impedance adjustment device 2111. The voltage across the impedance adjustment device 2111 is determined by a product of the resistance of the impedance adjustment device 2111 multiplied by the differential current IDM of the front stage amplification signal EAO. In this embodiment, as compared to the conventional multi-stage amplifier circuit 200, because the resistance of the impedance adjustment device 2111 is directly determined by the difference between the adjustment feedback signal VFBL and the adjustment reference signal VREFL, the resistance of the impedance adjustment device 2111 can more quickly respond to a variation of the output signal Vo (which corresponds to a variation of the adjustment feedback signal VFBL), so that the driving signal VdrvL and the output current Io can respond more quickly, thereby causing the output signal Vo to return to its steady state more quickly. More details in this regard will be described later with reference to the embodiments.

In one embodiment, the resistance of the impedance adjustment device 2111 is positively correlated with the difference between the adjustment feedback signal VFBL and the adjustment reference signal VREFL.

Figure 4:
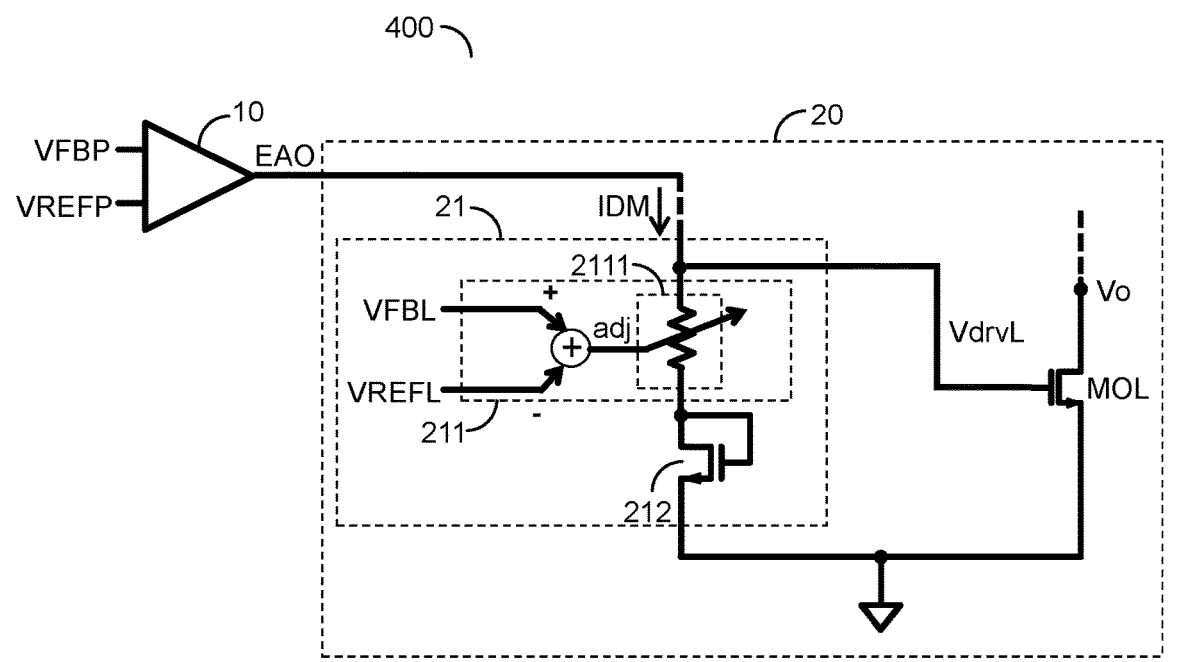
Figure 5:
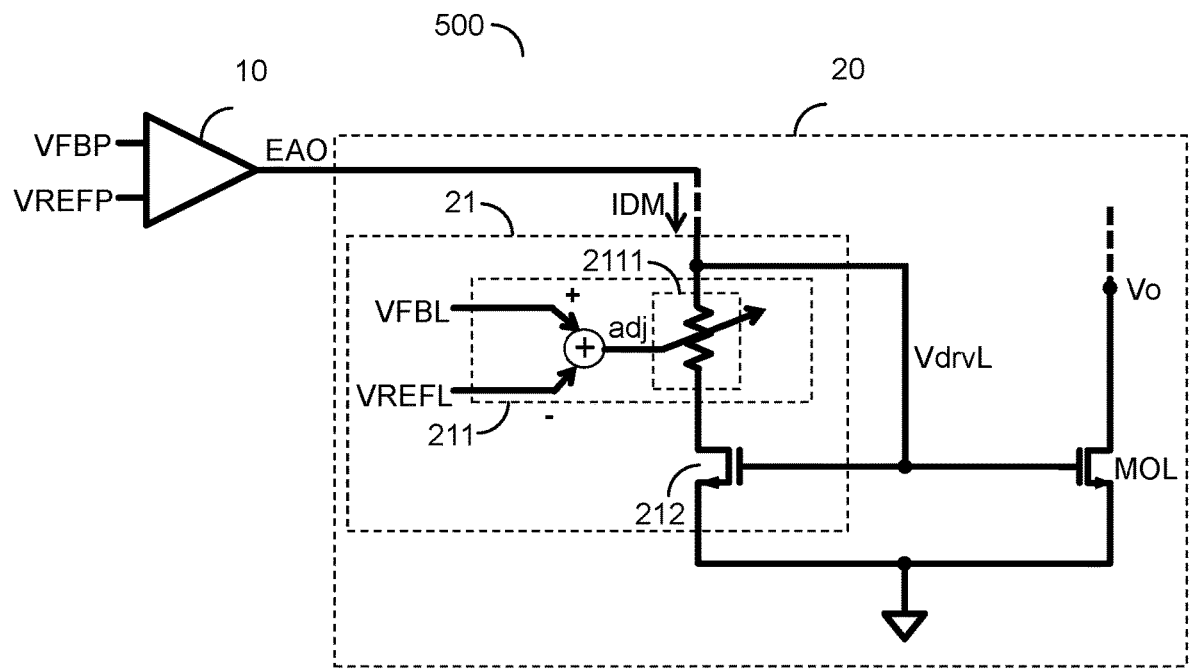
FIG. 5 shows a schematic diagram of an adjustment transistor in a multi-stage amplifier circuit according to another embodiment of the present invention.

Please refer to FIG. 4 and FIG. 5. FIG. 4 shows schematic diagram of an adjustment transistor in a multi-stage amplifier circuit according to an embodiment of the present invention, whereas, FIG. 5 shows a schematic diagram of an adjustment transistor in a multi-stage amplifier circuit according to another embodiment of the present invention. These two embodiments of FIG. 4 and FIG. 5 correspond to the embodiment of FIG. 3. In one embodiment, the adjustment transistor 212 is coupled as a diode (as shown in FIG. 4). In another embodiment, a gate of the adjustment transistor 212 is biased by the driving signal VdrvL (as shown in FIG. 5).

Figure 6:
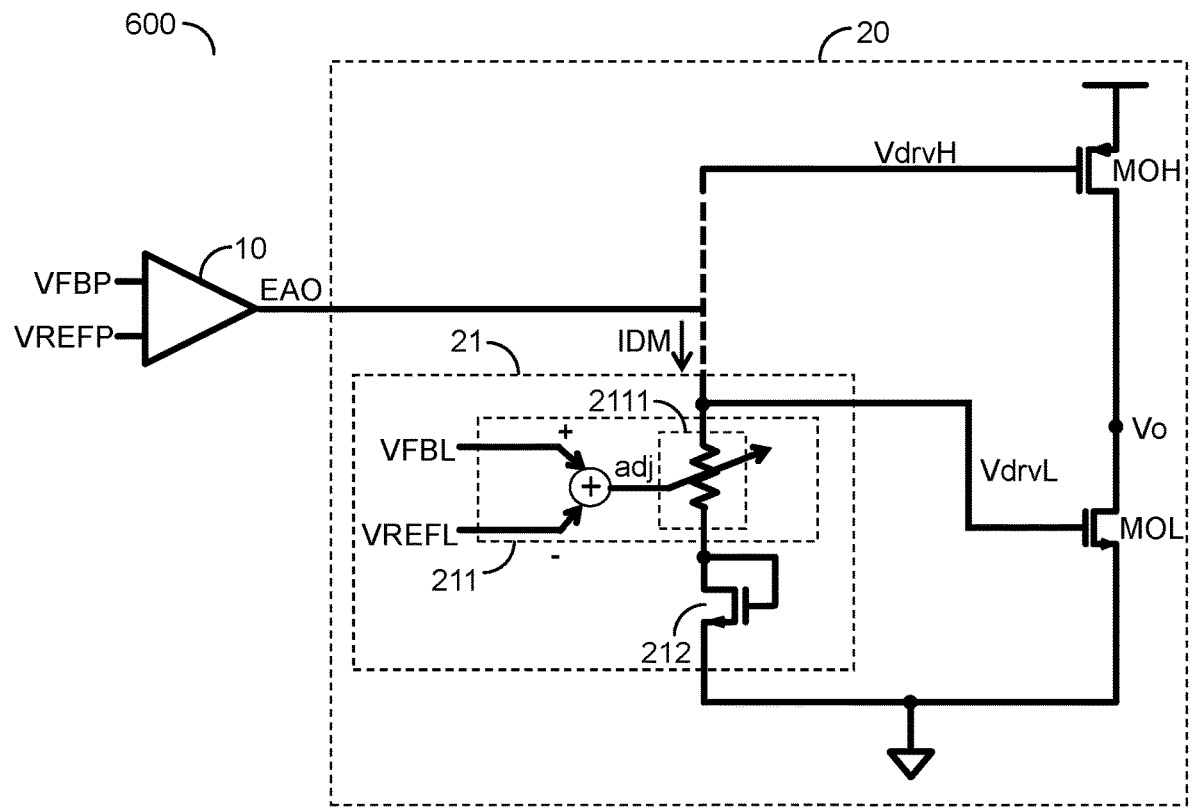
Figure 7:
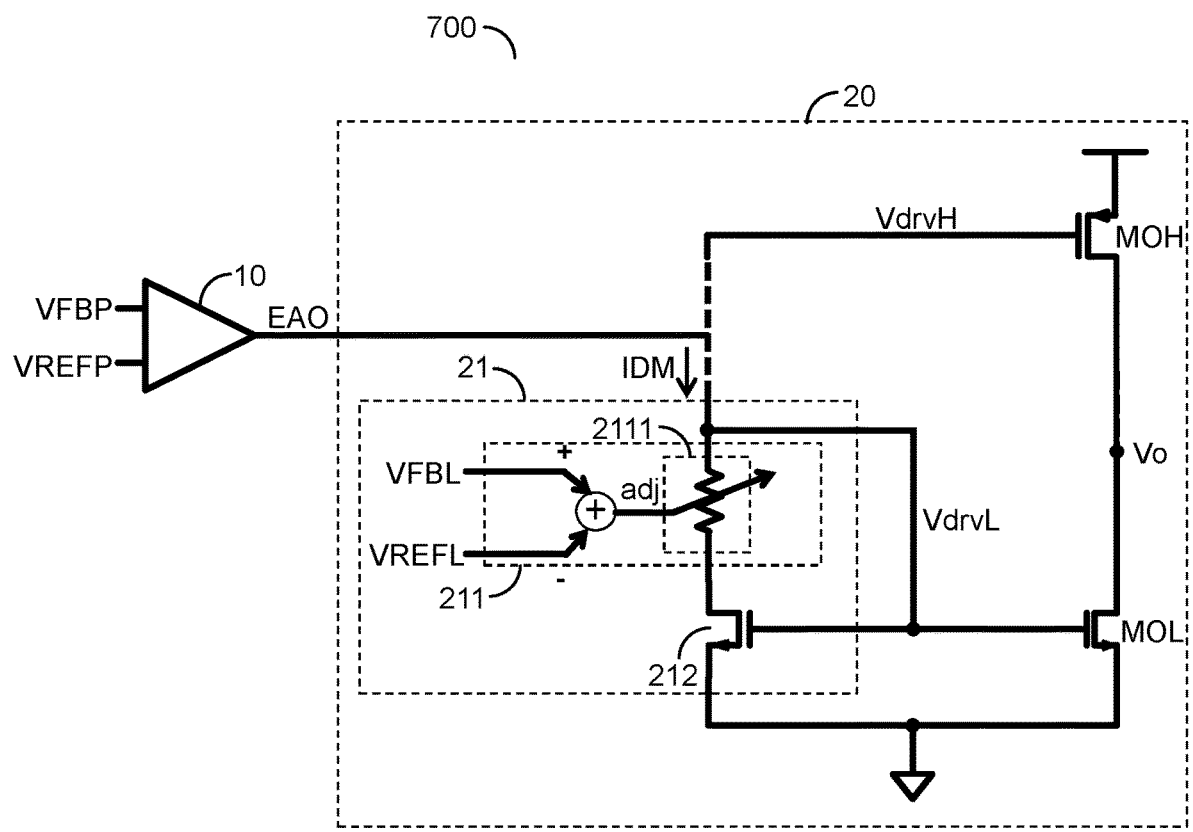
FIG. 7 shows a schematic diagram of a multi-stage amplifier circuit which includes plural output transistors according to another embodiment of the present invention.

Please refer to FIG. 6 and FIG. 7. FIG. 6 shows a schematic diagram of a multi-stage amplifier circuit which includes plural output transistors according to an embodiment of the present invention, whereas, FIG. 7 shows a schematic diagram of a multi-stage amplifier circuit which includes plural output transistors according to another embodiment of the present invention. FIG. 6 and FIG. 7 are two specific embodiments corresponding FIG. 4 and FIG. 5, respectively. Each of the output stage circuit 20 of the embodiment shown in FIG. 6 and the output stage circuit 20 of the embodiment shown in FIG. 7 further includes an output transistor MOH, which generates an output signal Vo according to the front stage amplification signal EAO. The output transistor MOH and the output transistor MOL have conduction type complementary to each other. For example, in the embodiments shown in FIG. 6 and FIG. 7, the output transistor MOH is a PMOS transistor, and the output transistor MOL is an NMOS transistor.

Figure 8:
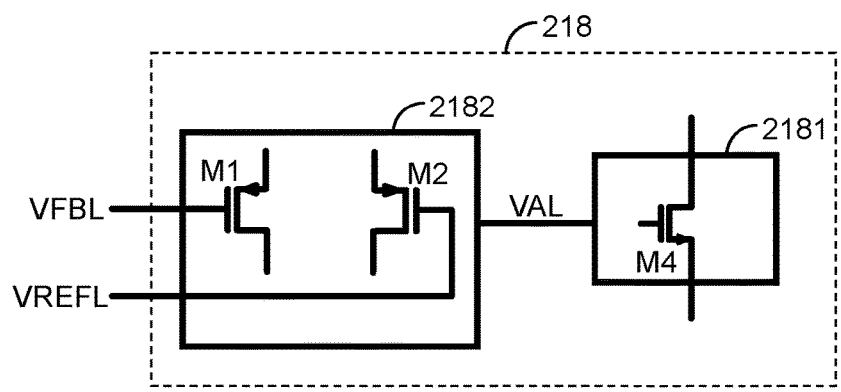
FIG. 8 shows a schematic circuit block diagram of a transconductance amplifier circuit in a multi-stage amplifier circuit according to an embodiment of the present invention.

Please refer to FIG. 8, which shows a schematic circuit block diagram of a transconductance amplifier circuit in a multi-stage amplifier circuit according to an embodiment of the present invention. In one embodiment, the impedance adjustment circuit 211 further includes transconductance amplifier circuit 218. In one embodiment, the transconductance amplifier circuit 218 includes: a pair of differential transistors M1 and M2 which constitute a differential pair 2182 and a transconductance transistor M4. The pair of differential transistors M1 and M2 are configured to operably generate an adjustment signal VAL according to the difference between the adjustment feedback signal VFBL and the adjustment reference signal VREFL. In one embodiment, the adjustment signal VAL is generated according to a differential current of the pair of differential transistors M1 and M2. In this embodiment, the transconductance transistor M4 corresponds to an impedance adjustment device 2181, wherein a resistance of the transconductance transistor M4 is adjusted according to the adjustment signal VAL.

Figure 9:
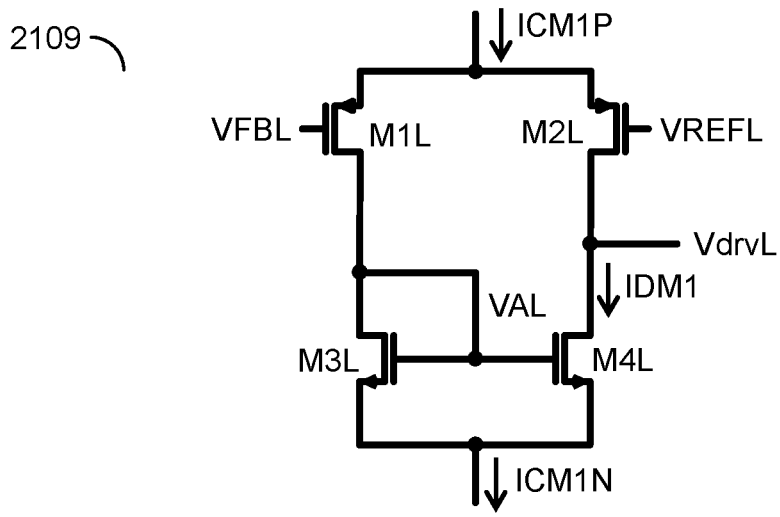
FIG. 9 to FIG. 11 show circuit configurations of a transconductance amplifier circuit in a multi-stage amplifier circuit according to several embodiments of the present invention.
Figure 10:
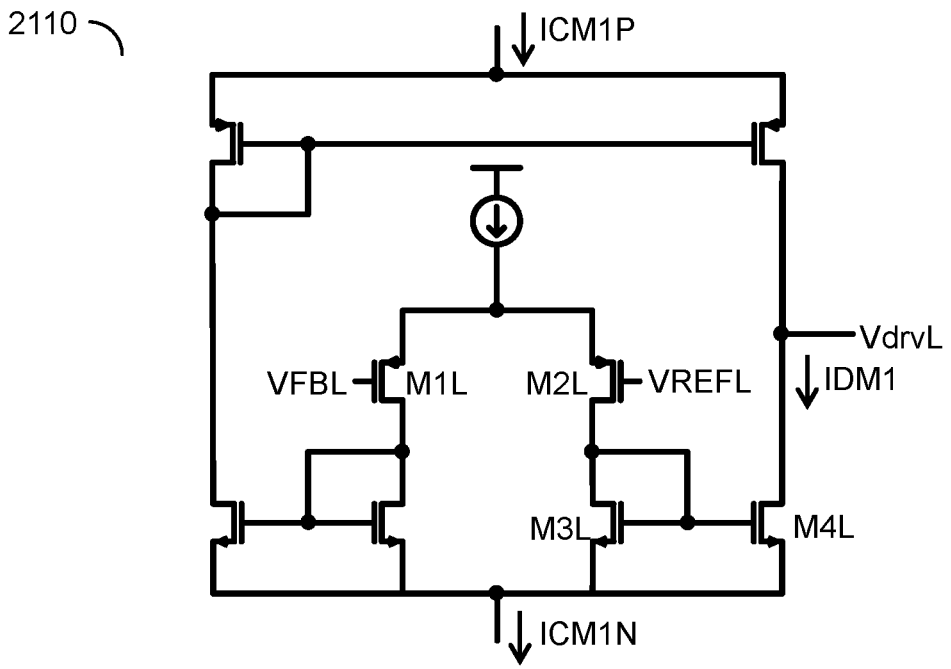
Figure 11:
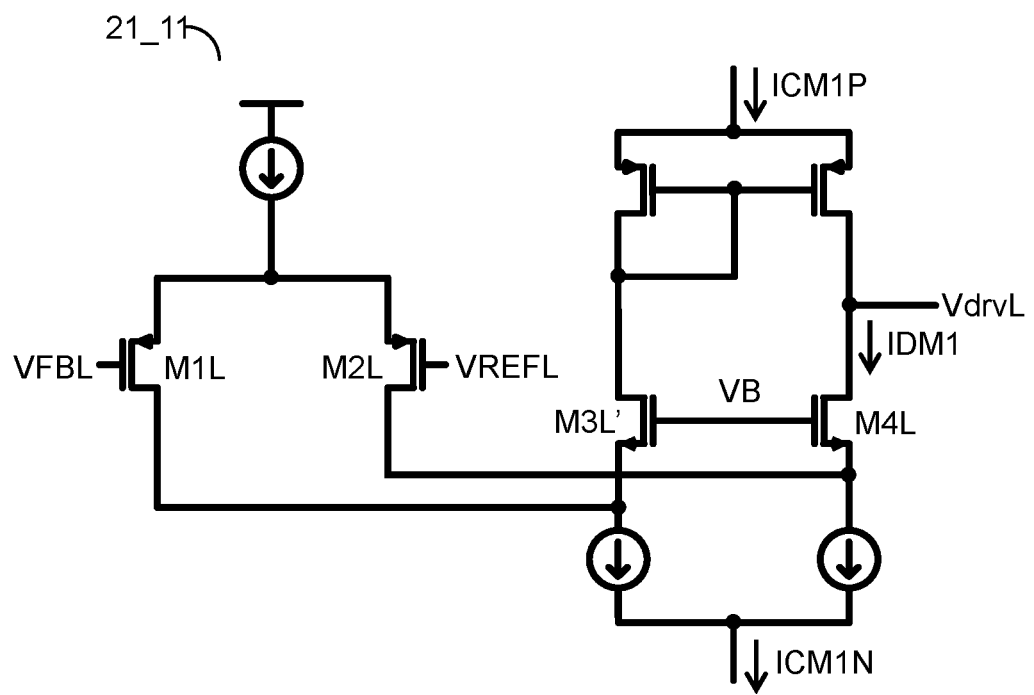

Please refer to FIG. 9 to FIG. 11, which show several embodiments of circuit configurations of a transconductance amplifier circuit in a multi-stage amplifier circuit according to the present invention, wherein the transconductance amplifier circuit functions as an impedance adjustment circuit.

In one embodiment, as shown in FIG. 9, the transconductance amplifier circuit further includes a load transistor, which is coupled as a diode. A current flowing through the differential transistor M1L biases the load transistor M3L, and is mirrored to generate the adjustment signal VAL for adjusting a resistance of the transconductance transistor M4L.

In the embodiment of FIG. 10, the transconductance amplifier circuit 2110 generates the driving signal VdrvL in a current push-pull fashion. In the embodiment of FIG. 11, the transconductance amplifier circuit 21_11 is implemented in a folded cascade fashion, so that the resistance of the transconductance transistor M4L is adjustable to adjust the driving signal VdrvL, wherein a bias voltage VB is provided to a gate of the transistor M3L' and a gate of the transconductance transistor M4L.

In one embodiment, the transconductance amplifier circuit is configured in a way such that a linear relationship lies between the resistance of the transconductance transistor M4L and the difference between the adjustment feedback signal VFBL and the adjustment reference signal VREFL. Under such circumstance, as compared to a situation wherein the front stage amplification circuit 10 generates a response in the driving signal VdrvL simply according to the difference between the primary feedback signal VFBP and the primary reference signal VREFP, when there is a difference lying between the adjustment feedback signal VFBL and the adjustment reference signal VREFL, the driving signal VdrvL can have a larger/faster response. As a result, for example, the multi-stage amplifier circuit described in the previous embodiments can significantly enhance the response speed of the output transistor MOL, the output current Io and the output signal Vo in a transient state by virtue of the fast response of the transconductance transistor (e.g., M4L) of the transconductance amplifier circuit. From one perspective, the transconductance amplifier circuit provides a feed-forward loop in the multi-stage amplifier circuit.

To elaborate in more detail, in one embodiment, when the output signal Vo is in a transient state, the transconductance transistor M4L is biased to operate in a saturation region, whereby the resistance of the transconductance transistor M4L is adjusted according to the adjustment signal VAL with a linear relationship therebetween. As exemplified by FIG. 9, in a case when the adjustment feedback signal VFBL rises to become higher than the adjustment reference signal VREFL, the current flowing through the differential transistor M1L and the transistor M3L will be relatively smaller than the current flowing through the right branch. As a result, under such situation, the adjustment signal VAL will decrease, so that the resistance of the transconductance transistor M4L will increase. On the other hand, because the differential transistor M2L will receive a relatively higher differential current IDM1, the driving signal VdrvL can be effectively and quickly increased, so as to quickly raise the current level of the output transistor MOL, thereby speeding up the response of the output signal Vo.

Figure 12:
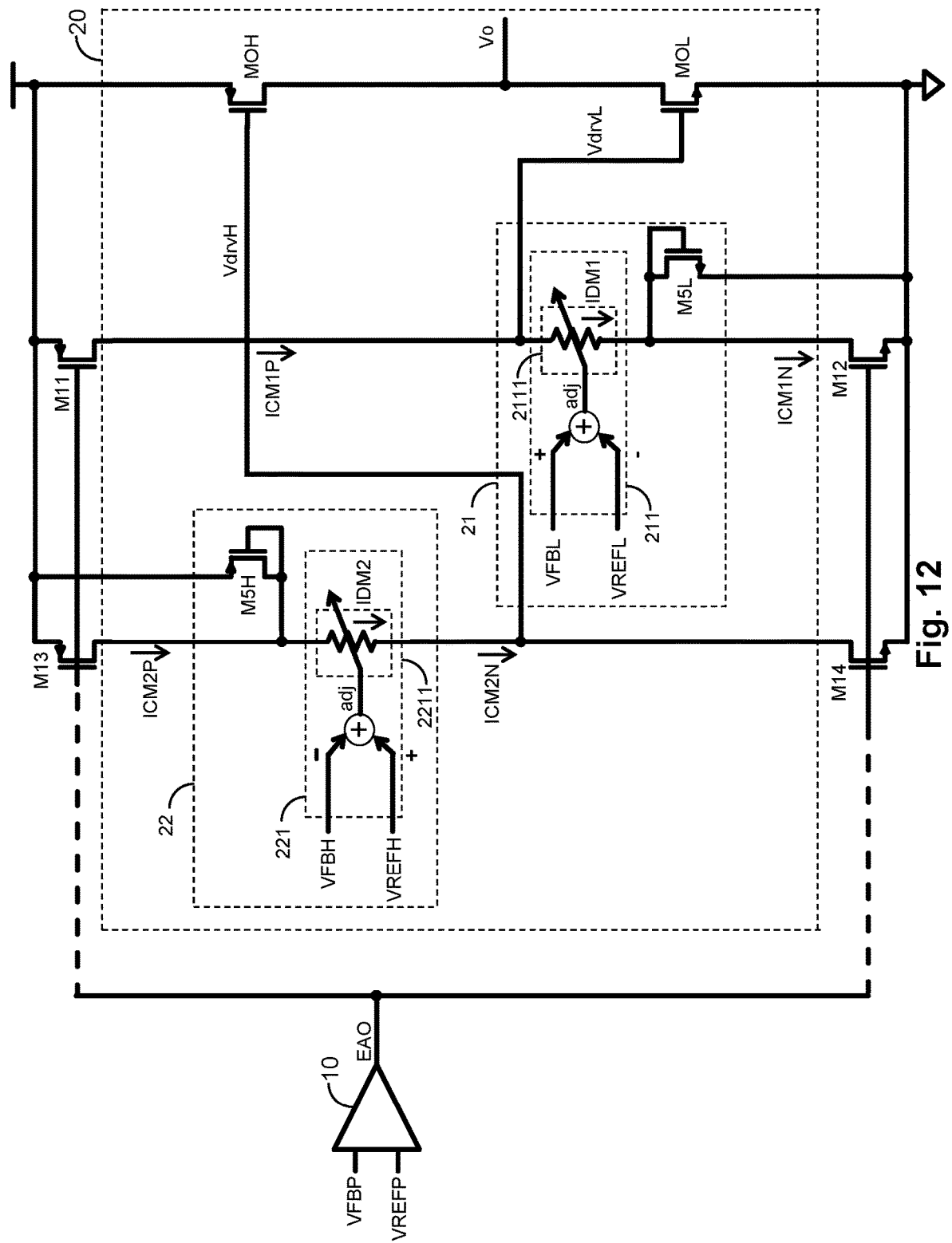
FIG. 12 and FIG. 13 show two schematic circuit block diagrams of a multi-stage amplifier circuit which includes output transistors complementary to each other according to two embodiments of the present invention, respectively.
Figure 13:
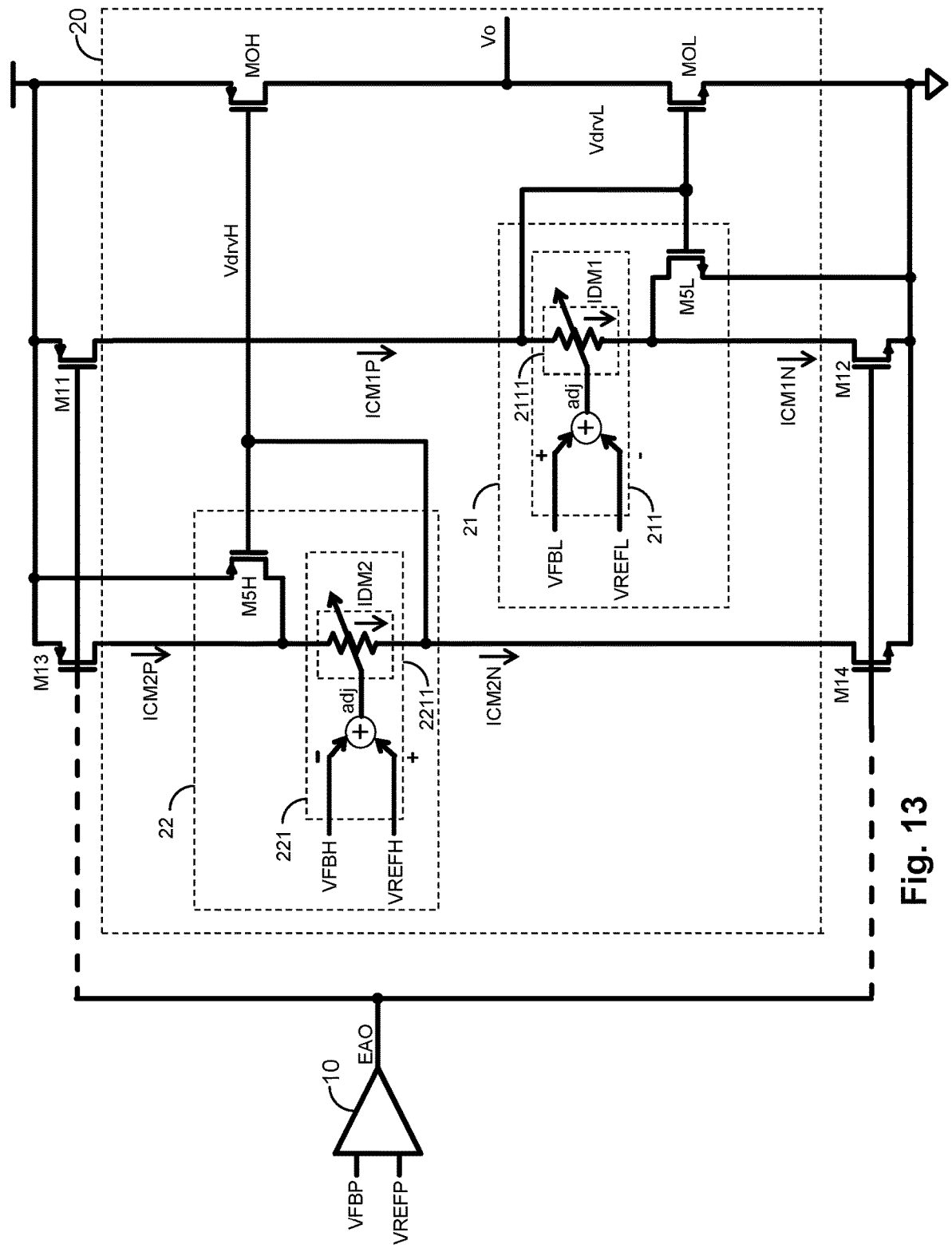

Please refer to FIG. 12 and FIG. 13, which show two schematic circuit block diagrams of a multi-stage amplifier circuit which includes output transistors complementary to each other according to two embodiments of the present invention, respectively. FIG. 12 and FIG. 13 are two specific embodiments corresponding FIG. 6 and FIG. 7, respectively.

The output transistor MOH and the output transistor MOL in FIG. 12 have conduction type complementary to each other. Likewise, the output transistor MOH and the output transistor MOL in FIG. 13 have conduction type complementary to each other. Each of the output stage circuit 20 of the embodiment shown in FIG. 12 and the output stage circuit 20 of the embodiment shown in FIG. 13 further includes an output adjustment circuit 22, which is configured to operably adjust a driving signal VdrvH according to a difference between an adjustment feedback signal VFBH and an adjustment reference signal VREFH, so as to control the output transistor MOH. Note that the above-mentioned control mechanism operated by the output adjustment circuit 22 is the same as the control mechanism operated by the output adjustment circuit 21. In these two embodiments, the output transistor MOH and the output transistor MOL generate the output signal Vo in a push-pull fashion. In these embodiments, the adjustment transistor M5L corresponds to the adjustment transistor 212 in the previous embodiments.

Figure 14:
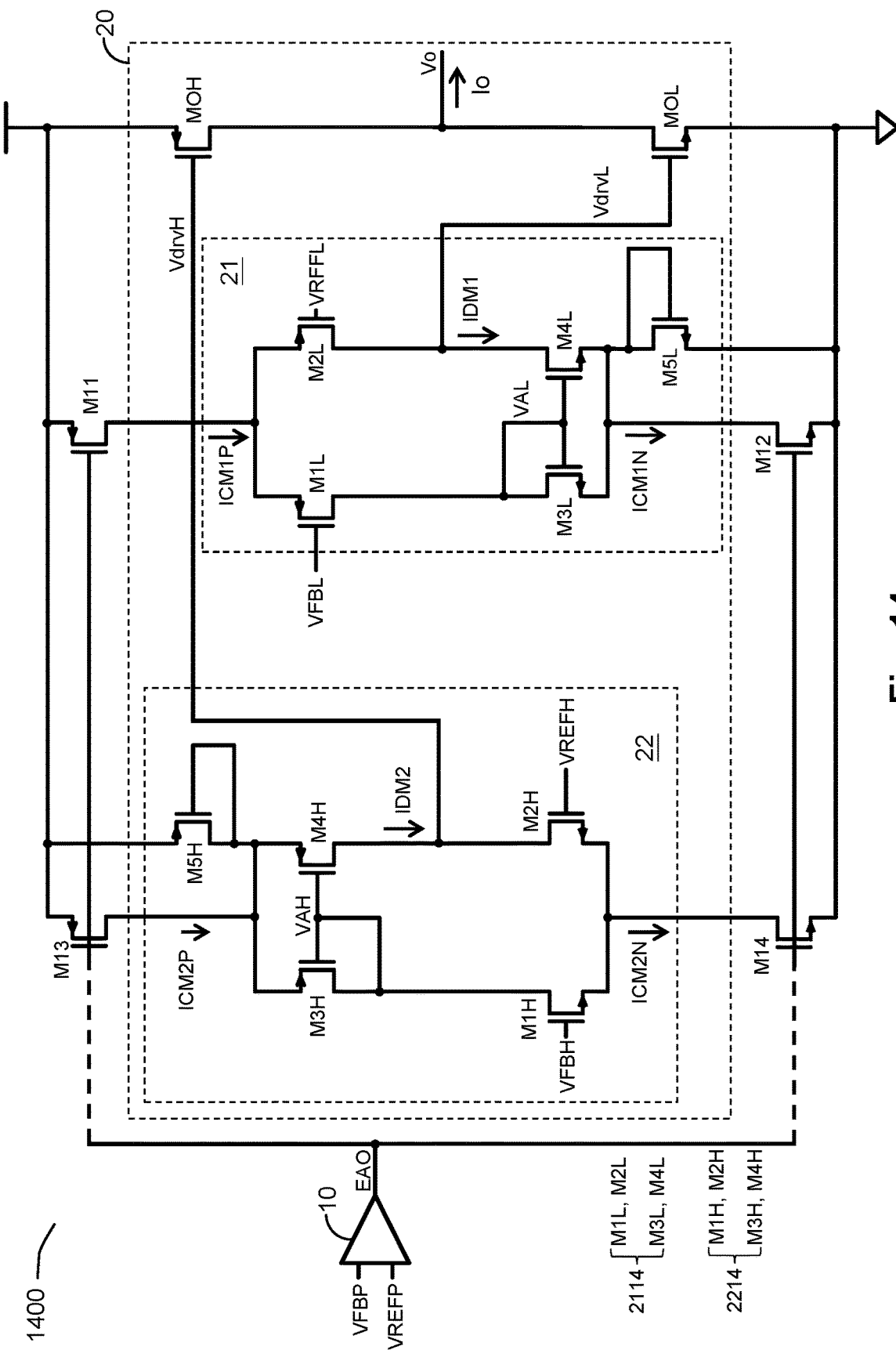
FIG. 14 and FIG. 15 show two schematic circuit diagrams of a multi-stage amplifier circuit which includes output transistors complementary to each other according to two specific embodiments of the present invention, respectively.
Figure 15:
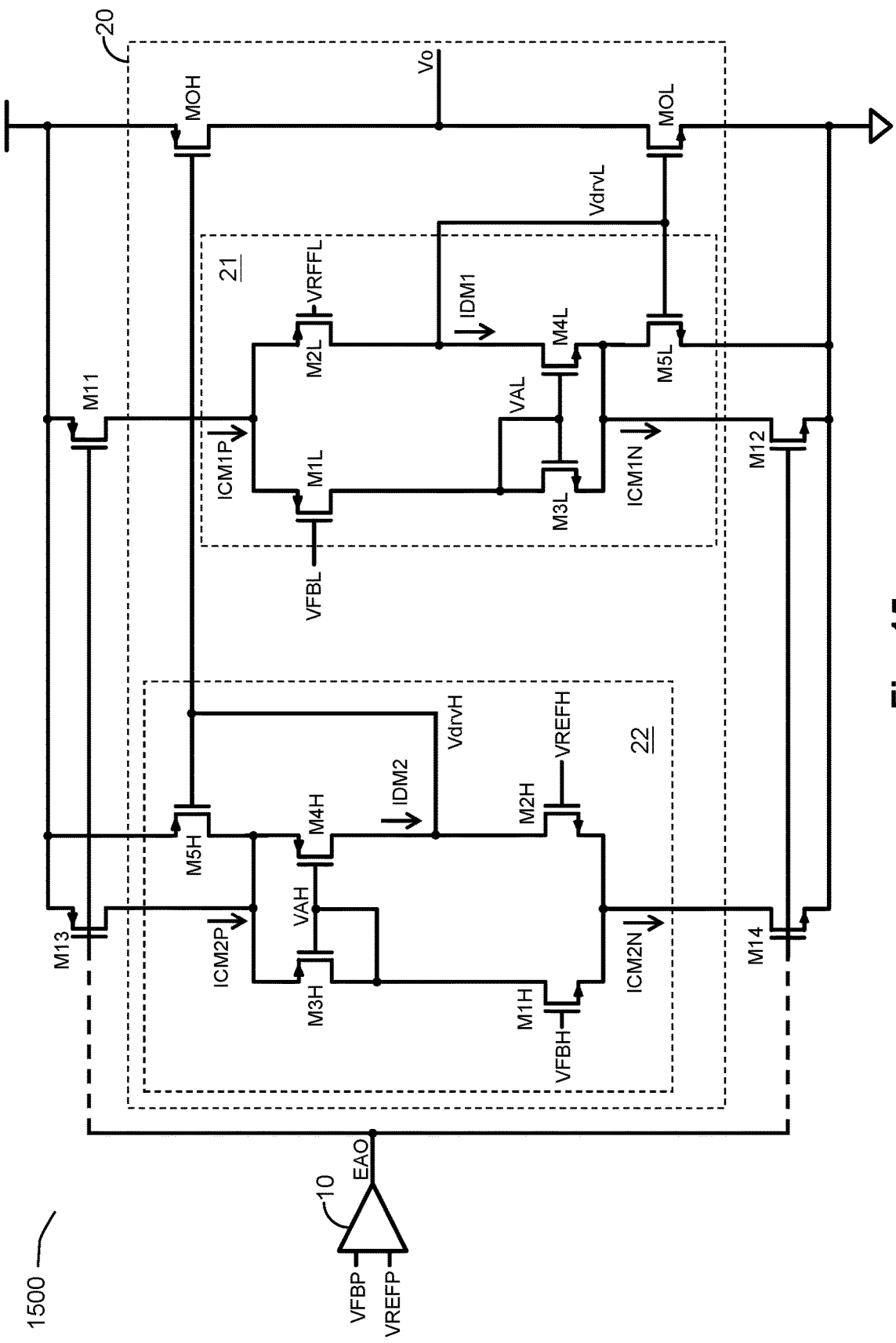

Please refer to FIG. 12 and FIG. 13 in conjugation with FIG. 14 and FIG. 15. FIG. 14 and FIG. 15 show two schematic circuit diagrams of a multi-stage amplifier circuit (i.e., multi-stage amplifier circuit 1400 of FIG. 14 and multi-stage amplifier circuit 1500 of FIG. 15) which includes output transistors complementary to each other according to two specific embodiments of the present invention, respectively. FIG. 14 and FIG. 15 are two specific embodiments corresponding FIG. 12 and FIG. 13, respectively. In one embodiment, as shown in FIG. 14 and FIG. 15, the circuit configuration of the output adjustment circuit 21 and the circuit configuration of the output adjustment circuit 22 are implemented in a way such that the output adjustment circuit 21 and the output adjustment circuit 22 have conduction type complementary to each other, so that the driving signal VdrvL generated by the output adjustment circuit 21 and the driving signal VdrvH generated by the output adjustment circuit 22 are complementary to each other, whereby the output transistor MOH and the output transistor MOL having conduction types complementary to each other are controlled to generate the output signal Vo in a push-pull fashion.

To be more specific, the transistor M1H, the transistor M2H, the transistor M3H, the transistor M4H and the transistor M5H correspond to the transistor M1L, the transistor M2L, the transistor M3L, the transistor M4L and the transistor M5L, respectively, but have complementary conduction types. The transistor M5H and the transistor M5L correspond to the adjustment transistor in the output adjustment circuit 22 and the output adjustment circuit 21, respectively. The adjustment signal VAH corresponds to the adjustment signal VAL but has a complementary conduction type.

From one perspective, in one embodiment, the transconductance transistor M4L is connected in series to the adjustment transistor M5L, and the transconductance transistor M4H is connected in series to the adjustment transistor M5H. As shown in FIG. 14 and FIG. 15, in one embodiment, in a transient state, when a difference occurs between the primary feedback signal VFBP and the primary reference signal VREFP, but due to a certain reason such as compensation such that the signal from the front stage amplification circuit 10 has not been effectively transmitted to the bias transistor M11 and the bias transistor M12, a large signal common mode current ICM1P through the bias transistor M11 is approximately equal to a large signal common mode current ICM1N through the bias transistor M12. Under such circumstance, the transconductance amplifier circuit 2114 is substantially biased by the common mode current ICM1P and the common mode current ICM1N generated according to the front stage amplification signal EAO. On the other hand, under such circumstance, the difference between the adjustment feedback signal VFBL and the adjustment reference signal VREFL is sufficiently large to cause resistance of the transconductance transistor M4L to change in response to the difference between the adjustment feedback signal VFBL and the adjustment reference signal VREFL. As a consequence, the differential current IDM1 of the transconductance amplifier circuit 2114 can generate the driving signal VdrvL via the resistance of the transconductance transistor M4L and the resistance of the adjustment transistor M5L. Under such circumstance, the driving signal VdrvL can effectively respond to the difference between the adjustment feedback signal VFBL and the adjustment reference signal VREFL, so the overall response time is not limited by the relatively slower response speed of the front stage amplification signal EAO. The transconductance amplifier circuit 2214 also operates similarly as above, so the details thereof are not redundantly repeated here.

It is worthwhile mentioning that, because the large signal common mode current ICM1P of the bias transistor M11 is approximately equal to the large signal common mode current ICM1N of the bias transistor M12 (also ICM2P is approximately equal to ICM2N), from one perspective, as shown in FIG. 12 and FIG. 13, the transistor M5L (i.e., adjustment transistor) is biased by the differential current IDM1 of the front stage amplification signal EAO, whereas, the transistor M5H (i.e., adjustment transistor) is biased by the differential current IDM2 of the front stage amplification signal EAO.

From one perspective, in the embodiments shown in FIG. 12 to FIG. 15, the output transistor MOH, the output transistor MOL, the output adjustment circuit 22 and the output adjustment circuit 21 are implemented as a class AB output stage circuit.

Figure 16:
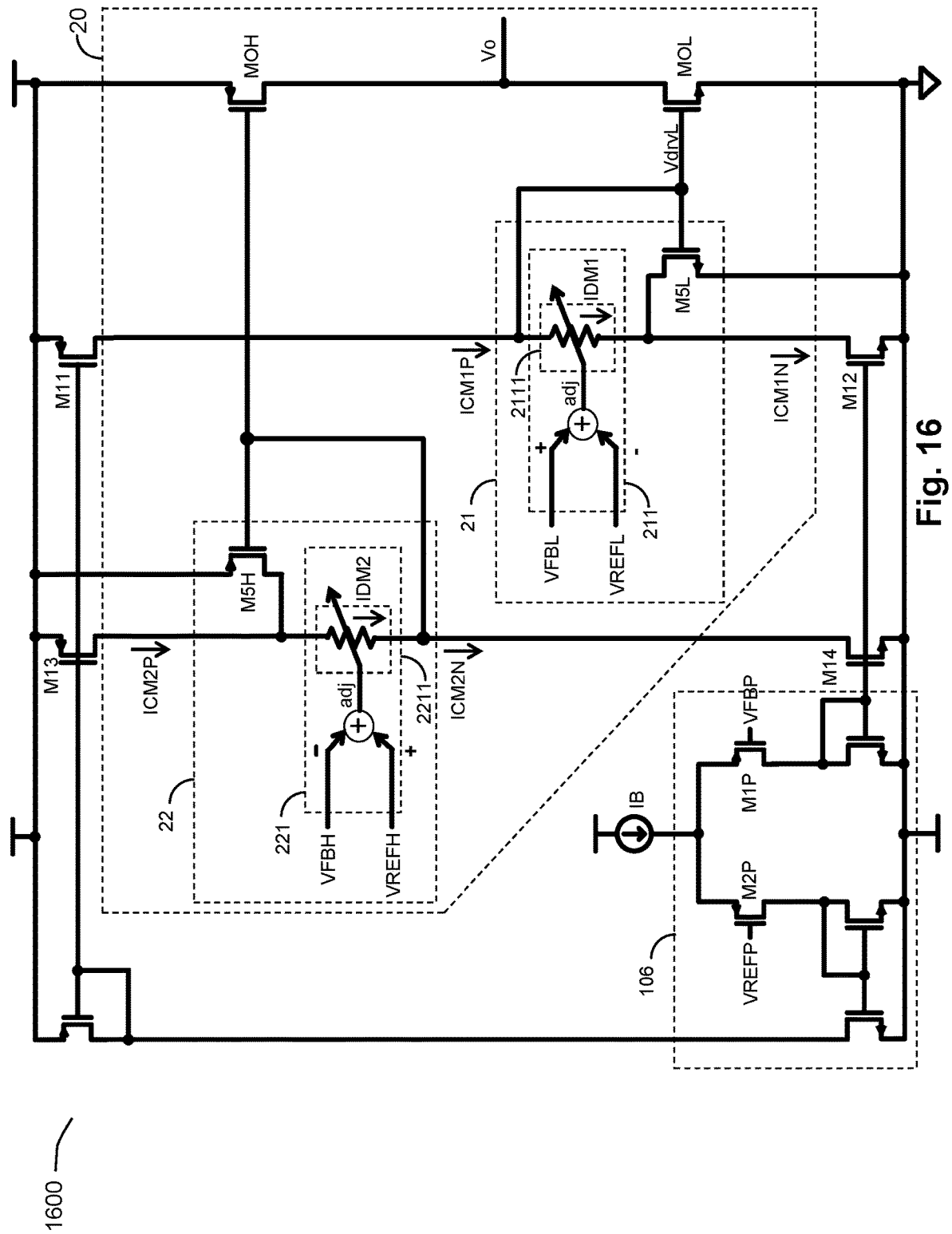
FIG. 16 and FIG. 17 show two schematic circuit diagrams of a multi-stage amplifier circuit which is implemented as an operational amplifier according to two specific embodiments of the present invention, respectively.
Figure 17:
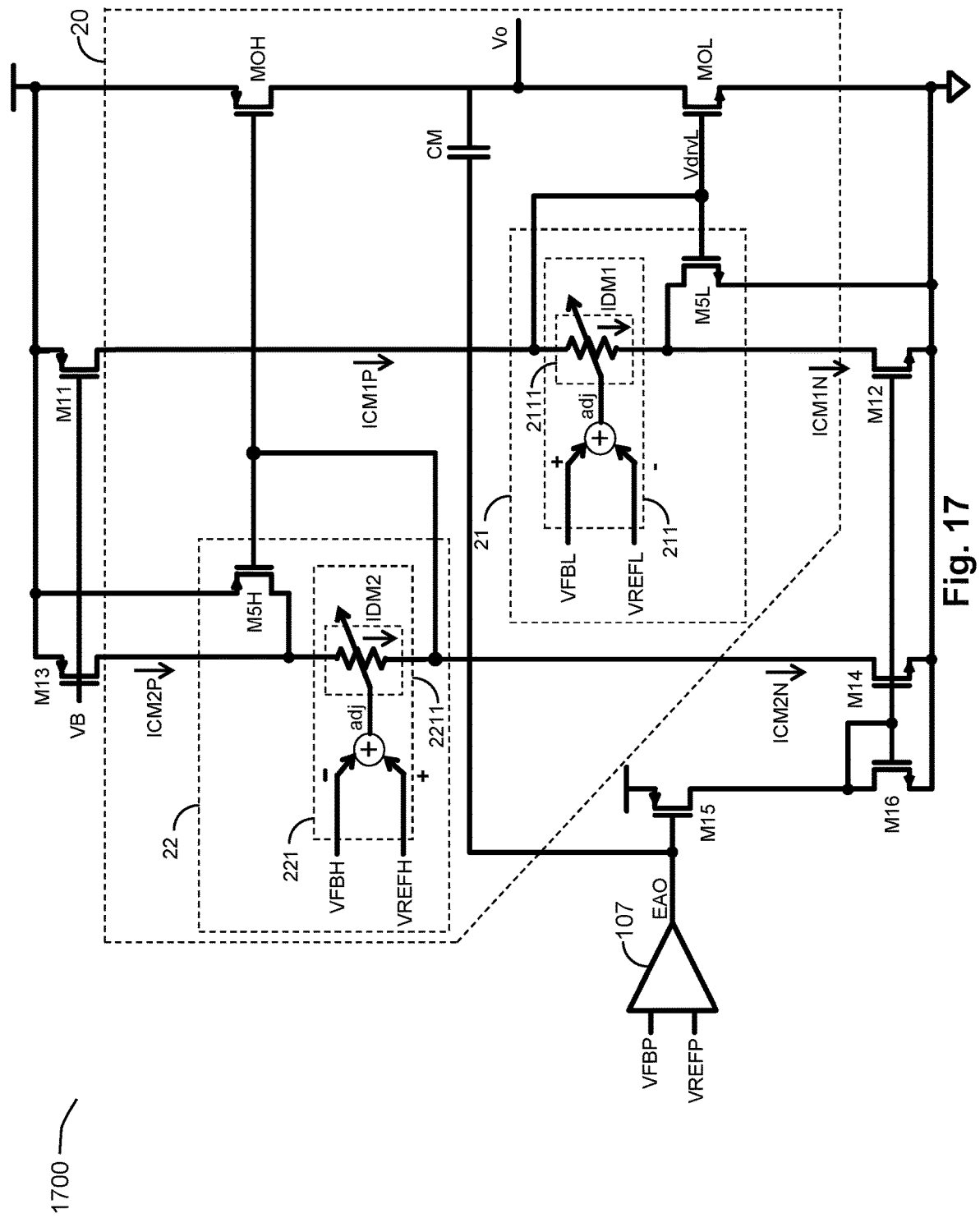

Please refer to FIG. 16 and FIG. 17, which show two schematic circuit diagrams of a multi-stage amplifier circuit which is implemented as an operational amplifier according to two specific embodiments of the present invention, respectively. As shown in FIG. 16 and FIG. 17, in these two specific embodiments, the multi-stage amplifier circuit 1600 or 1700 of the present invention is implemented as an operational amplifier. In one embodiment, the front stage amplification circuit 10 is implemented as a transconductance amplifier circuit (e.g., 106). The transconductance amplifier circuit (e.g., 106) is configured to operably generate at least one pair of transconductance currents (i.e., ICM1P and ICM1N; or, ICM2P and ICM2N) according to a difference between the primary feedback signal VFBP and the primary reference signal VREFP. A common mode current and a differential current (i.e., IDM1 or IDM2) which are generated according to the front stage amplification signal EAO are determined by the above-mentioned transconductance currents.

It is noteworthy that, in one embodiment, the multi-stage amplifier circuit (e.g., multi-stage amplifier circuit 1700 of FIG. 17) of the present invention further comprises a Miller compensation capacitor CM, which is coupled between the output signal Vo and the front stage amplification signal EAO. The Miller compensation capacitor CM is provided for frequency compensation to enhance the stability of the multi-stage amplifier circuit. Please refer back to FIG. 1 and FIG. 2. In the prior arts shown in FIG. 1 and FIG. 2, when an output voltage Vo is in a transient state, because of the effect of the Miller compensation capacitor CM, the response of the front stage amplification signal EAO will become slow, such that the transistor MC14 cannot quickly respond to the transient variation of the output voltage. Consequently, the prior arts cannot instantly control the output transistor MOH and the output transistor MOL to quickly respond to the transient variation of the output voltage Vo.

Figure 1:
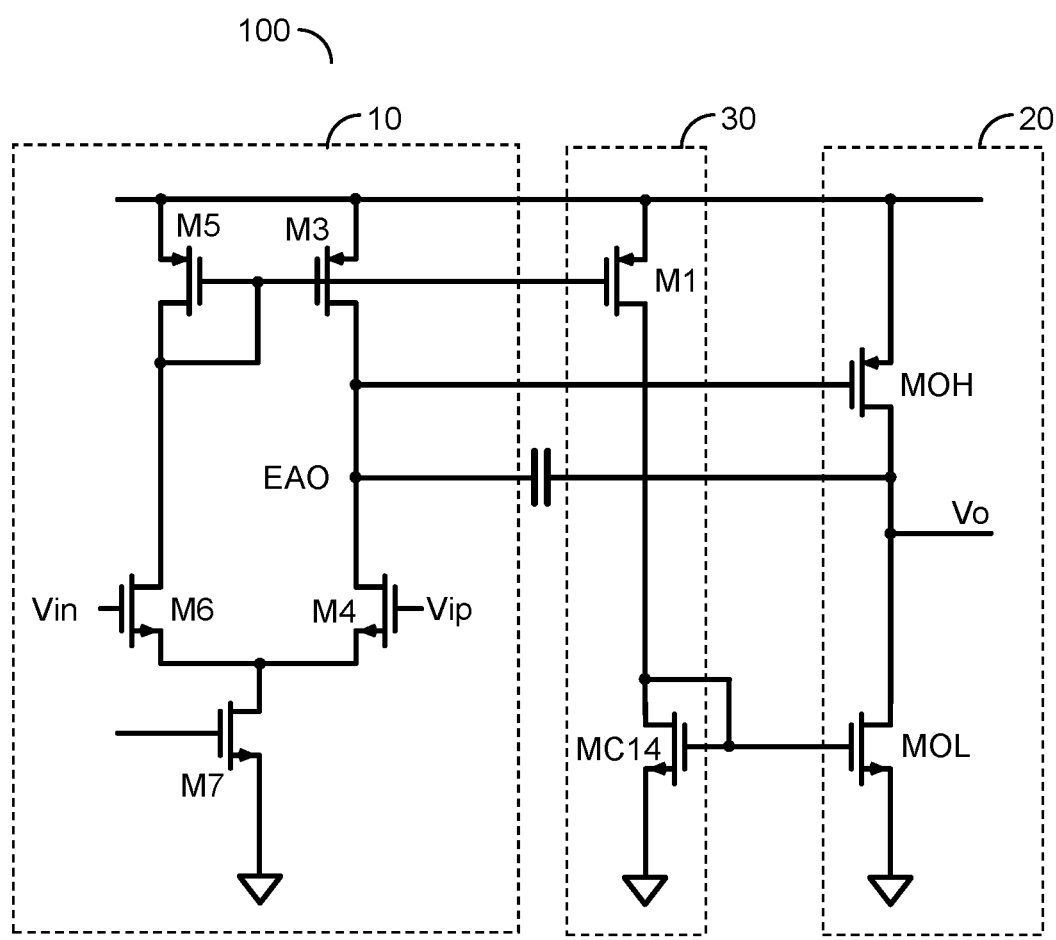
FIG. 1 shows a schematic diagram of a conventional multi-stage amplifier circuit.
Figure 2:
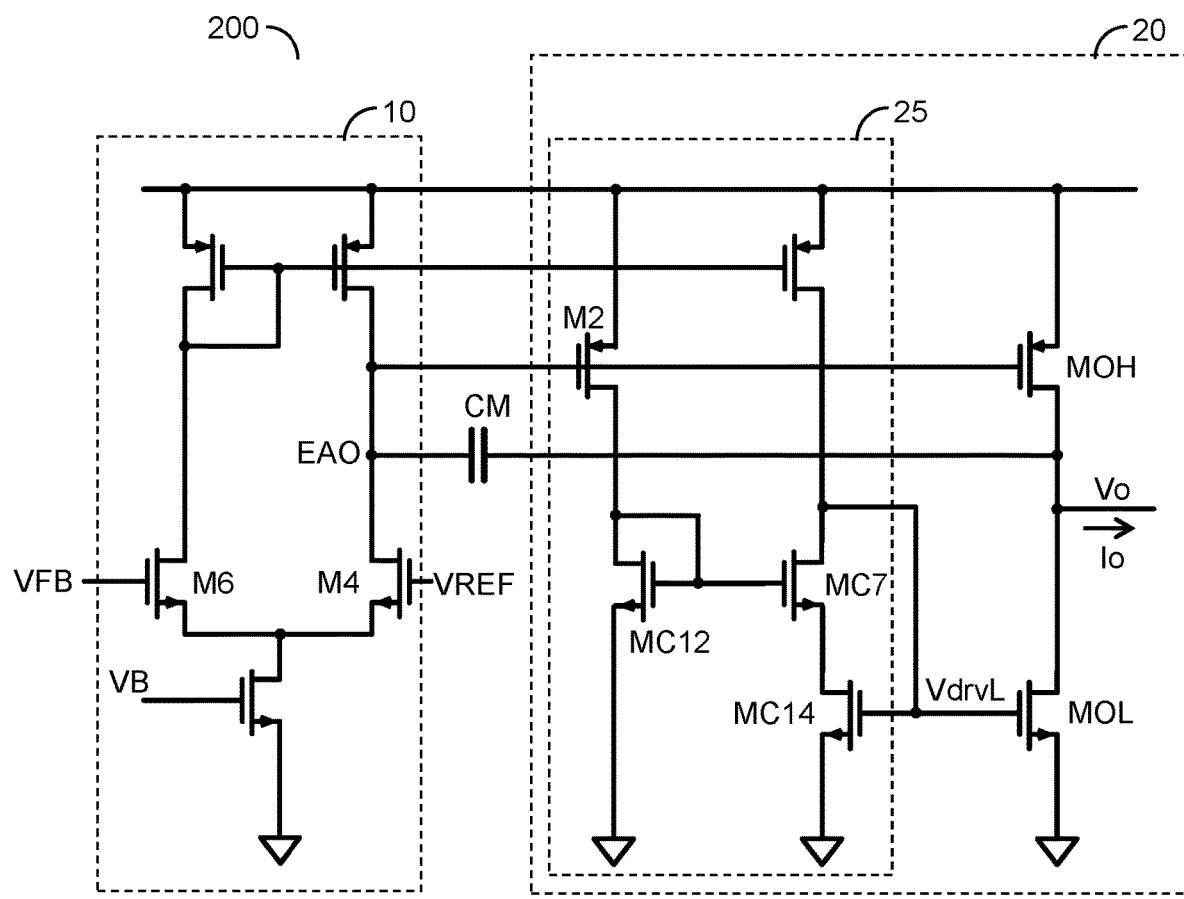
FIG. 2 shows a schematic diagram of another conventional multi-stage amplifier circuit.

As compared to the prior arts shown in FIG. 1 and FIG. 2, because the multi-stage amplifier circuit of the present invention provides an output adjustment circuit (e.g., output adjustment circuit 21 and output adjustment circuit 22 in the multi-stage amplifier circuit 1700 shown in FIG. 17), as described above, the output adjustment circuit of the present invention can quickly respond to the transient variation of the output voltage, so as to instantly and proactively control the transient responses of the driving signal VdrvL and the driving signal VdrvH, thereby instantly controlling the output transistor MOH and the output transistor MOL to quickly respond to the transient variation of the output voltage.

In one embodiment, an adjustment target value of the output signal Vo corresponding to the output adjustment circuit (e.g., output adjustment circuit 21 and output adjustment circuit 22) is the same as an output target value of the output signal Vo corresponding to the front stage amplification circuit 10. Such criteria can be fulfilled for example by adopting the same feedback gain and by configuring the primary reference signal VREFP, the adjustment reference signal VREFL and the adjustment reference signal VREFH to be the same.

In another embodiment, a bias value is intentionally provided between an adjustment target value of the output signal Vo corresponding to the output adjustment circuit (e.g., output adjustment circuit 21 and output adjustment circuit 22) and an output target value of the output signal Vo corresponding to the front stage amplification circuit 10. Under such configuration, when the output signal Vo exceeds the output target value by a difference which is greater than the bias value, the output adjustment circuit (e.g., output adjustment circuit 21 and output adjustment circuit 22) will dominate the control of the loop. In one embodiment, for example referring to FIG. 3, the adjustment reference signal VREFL is greater than the primary reference signal VREFP by a reference bias value; under such circumstance, when the adjustment feedback signal VFBL is greater than the adjustment reference signal VREFL (which indicates that the output signal Vo exceeds the output target value by a difference which is greater than the bias value), the loop controlled by the output adjustment circuit 21 will be the dominate factor to determine the feedback bandwidth. Consequently, even if the loop of the front stage amplification circuit 10 has not yet responded in time to control the output transistor MOL, the loop controlled by the output adjustment circuit 21 can dominate the control of the output transistor MOL to respond in time.

Figure 18:
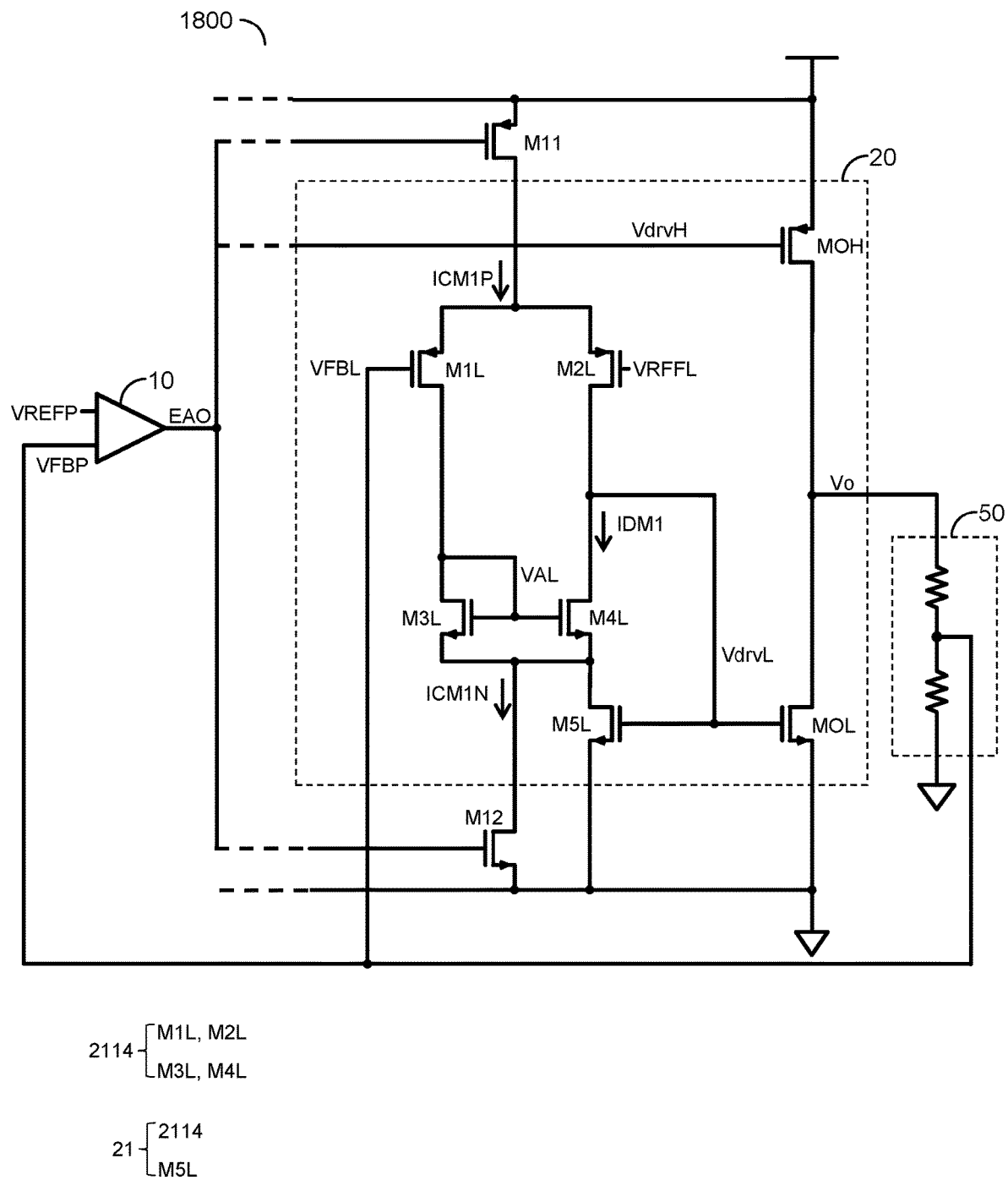
FIG. 18 shows a schematic circuit diagram of a regulator circuit according to a specific embodiment of the present invention.

Please refer to FIG. 18, which shows a schematic circuit diagram regulator circuit according to a specific embodiment of the present invention. The regulator circuit 1800 comprises a multi-stage amplifier circuit as described in any of the previous embodiments and a feedback circuit 50. For example, the embodiment of FIG. 18 is obtained by combining the embodiment of FIG. 7 and the embodiment of FIG. 9. The feedback circuit 50 is configured to operably divide the output signal Vo to generate the primary feedback signal VFBP and the adjustment feedback signal VFBL. In this embodiment, the front stage amplification circuit 10 generates the front stage amplification signal EAO according to a difference between the primary feedback signal VFBP and the primary reference signal VREFP, so as to regulate the output signal Vo to an output target value.

Besides, in this embodiment, the adjustment feedback signal VFBL of the output adjustment circuit 21 is directly coupled to the primary feedback signal VFBP. The numerical reference number "2114" indicates the above-mentioned transconductance amplifier circuit.

In one embodiment, the primary reference signal VREFP can be implemented to be the same as the adjustment reference signal VREFL.

In another embodiment, the adjustment reference signal VREFL is greater than the primary reference signal VREFP by a reference bias value. Under such circumstance, when the adjustment feedback signal VFBL is greater than the adjustment reference signal VREFL (which indicates that the output signal Vo exceeds the output target value by a difference which is greater than the bias value), the loop controlled by the output adjustment circuit 21 will be the dominate factor to determine the feedback bandwidth. Consequently, even if the loop of the front stage amplification circuit 10 has not yet responded in time to control the output transistor MOL, the loop controlled by the output adjustment circuit 21 can dominate the control of the output transistor MOL to respond in time, so that the output signal Vo in a transient state is quickly regulated to be not exceeding a sum of the output target value plus the bias value. In one embodiment, the above-mentioned configuration can be applied to over-voltage protection, wherein an over-voltage threshold can be for example the above-mentioned sum of the output target value plus the output bias value.

Please still refer to FIG. 18. On the other hand, in the above-mentioned configuration wherein a difference (i.e., reference bias value) lies between the adjustment reference signal VREFL and the primary reference signal VREFP, in a steady state, the output signal Vo is regulated to the output target value according to the difference between the primary feedback signal VFBP and the primary reference signal VREFP by the front stage amplification circuit 10. Under such situation, because the output signal Vo is lower than the output target value, the adjustment feedback signal VFBL is lower than the adjustment reference signal VREFL. Consequently, under such situation, the common mode currents ICM1P and ICM1N only flow through the differential transistor M1L and the load transistor M3L, while the differential transistor M2L is cutoff and the transconductance transistor M4L is ON, and the adjustment transistor M5L and the output transistor MOL are substantially cutoff. That is, in this embodiment, in the steady state the multi-stage amplifier circuit of the present invention can save power consumption, while in the transient state the multi-stage amplifier circuit of the present invention can quickly respond.

It is worthwhile mentioning that, in simulations of the multi-stage amplifier circuit of the present invention, even if in a transient state the output signal Vo is allowed to vary in a relatively broader range (e.g., in a range exceeding the applicable range for a small signal model) to obtain a biased state for gain marginal analysis or a phase marginal analysis of an AC model, a reliable simulation computation result can be obtained. However on the contrary, in a condition wherein the output signal Vo of the prior arts undergoes a relatively large variation, the gain marginal analysis or phase marginal analysis of an AC model does not effectively reflect the genuine stability of the multi-stage amplifier circuit.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A multi-stage amplifier circuit, comprising:
   a front stage amplification circuit, which is configured to operably generate a front stage amplification signal according to a difference between a primary feedback signal and a primary reference signal;
   at least one output adjustment circuit, which is configured to operably generate a driving signal according to the front stage amplification signal; and
   at least one output transistor, which is under control by the driving signal to operably generate an output signal;
   wherein the primary feedback signal is correlated with the output signal, and wherein a gate-source voltage of the at least one output transistor is determined by the driving signal, so as to determine an output current of the output signal;
   wherein each of the at least one output adjustment circuit includes:
      an adjustment transistor, which is biased by a differential current of the front stage amplification signal; and
      an impedance adjustment circuit coupled to the adjustment transistor, wherein the impedance adjustment circuit includes:
         an impedance adjustment device, which is biased by the differential current of the front stage amplification signal, wherein a resistance of the impedance adjustment device is determined by a difference between an adjustment feedback signal and an adjustment reference signal, wherein the adjustment feedback signal is correlated with the output signal;
   wherein the driving signal is determined by a drain-source voltage of the adjustment transistor and a voltage across the impedance adjustment device, wherein the voltage across the impedance adjustment device is determined by a product of the resistance of the impedance adjustment device multiplied by the differential current of the front stage amplification signal.

2. The multi-stage amplifier circuit of claim 1, wherein the impedance adjustment circuit further includes a transconductance amplifier circuit, which includes:

a pair of differential transistors, which are configured to operably generate an adjustment signal according to the difference between the adjustment feedback signal and the adjustment reference signal;
a transconductance transistor which functions as the impedance adjustment device, wherein a resistance of the transconductance transistor is adjusted according to the adjustment signal.

3. The multi-stage amplifier circuit of claim 2, wherein a linear relationship lies between the resistance of the transconductance transistor and the difference between the adjustment feedback signal and the adjustment reference signal.

4. The multi-stage amplifier circuit of claim 3, wherein in a case when the output signal is in a transient state, the transconductance transistor is biased to operate in a saturation region, so that the resistance of the transconductance transistor is adjusted according to the adjustment signal with a linear relationship therebetween.

5. The multi-stage amplifier circuit of claim 2, wherein the transconductance transistor is connected in series to the adjustment transistor.

6. The multi-stage amplifier circuit of claim 2, wherein the transconductance amplifier circuit is biased by a common mode current from the front stage amplification signal.

7. The multi-stage amplifier circuit of claim 6, wherein the front stage amplification circuit is implemented as an operational amplifier, which is configured to operably generate at least one pair of transconductance currents complementary to each other according to the difference between the primary feedback signal and the primary reference signal, wherein the common mode current from the front stage amplification signal and the difference current of the front stage amplification signal are determined by the pair of transconductance currents.

8. The multi-stage amplifier circuit of claim 2, wherein the adjustment transistor is coupled as a diode.

9. The multi-stage amplifier circuit of claim 2, wherein a gate of the adjustment transistor is biased by the driving signal.

10. The multi-stage amplifier circuit of claim 2, wherein the transconductance amplifier circuit further includes: a load transistor, which is coupled as a diode, wherein a current flowing through one of the pair of differential transistors is configured to operably bias the load transistor, so as to generate the adjustment signal.

11. The multi-stage amplifier circuit of claim 2, wherein a bias value lies between an adjustment target value of the output adjustment circuit and an output target value of the front stage amplification circuit, so that when the output signal exceeds the output target value by a difference which is greater than the bias value, the output adjustment circuit controls the output transistor according to the adjustment target value, so that in a transient state, the output signal is regulated such that the output signal does not exceed a sum of output target value plus the bias value.

12. The multi-stage amplifier circuit of claim 2, wherein the at least one output transistor includes:
a first output transistor and a second output transistor, which have conduction types complementary to each other;
wherein the at least one output adjustment circuit includes: a first output adjustment circuit and a second output adjustment circuit, which are configured to operably and respectively generate corresponding driving signals according to the front stage amplification signal, so as to respectively control the first output transistor and the second output transistor, thereby generating the output signal.

13. The multi-stage amplifier circuit of claim 12, wherein a circuit configuration of the first output adjustment circuit and a circuit configuration of the second output adjustment circuit are complementary to each other, so that the driving signal of the first output adjustment circuit and the driving signal of the second output adjustment circuit are complementary to each other, whereby the first output transistor and the second output transistor generate the output signal in a push-pull fashion.

14. The multi-stage amplifier circuit of claim 13, wherein the first output transistor, the second output transistor, the first output adjustment circuit and the second output adjustment circuit are implemented as a class AB output stage circuit.

15. The multi-stage amplifier circuit of claim 14, wherein the multi-stage amplifier circuit is implemented as an operational amplifier.

16. The multi-stage amplifier circuit of claim 1, further comprising:
a compensation capacitor coupled between the front stage amplification signal and the output signal, wherein the compensation capacitor is configured to operably provide frequency compensation.

17. A regulator circuit, comprising:
a multi-stage amplifier circuit; and
a feedback circuit coupled to the output signal, wherein the feedback circuit is configured to operably generate a primary feedback signal and an adjustment feedback signal, whereby the multi-stage amplifier circuit regulates the output signal to an output target value;
wherein the multi-stage amplifier circuit includes:
a front stage amplification circuit, which is configured to operably generate a front stage amplification signal according to a difference between a primary feedback signal and a primary reference signal;
at least one output adjustment circuit, which is configured to operably generate a driving signal according to the front stage amplification signal; and
at least one output transistor, which is under control by the driving signal to operably generate an output signal;
wherein the primary feedback signal is correlated with the output signal, and wherein a gate-source voltage of the at least one output transistor is determined by the driving signal, so as to determine an output current of the output signal;
wherein each of the at least one output adjustment circuit includes:
an adjustment transistor, which is biased by a differential current of the front stage amplification signal; and
an impedance adjustment circuit coupled to the adjustment transistor, wherein the impedance adjustment circuit includes:
an impedance adjustment device, which is biased by the differential current of the front stage amplification signal, wherein a resistance of the impedance adjustment device is determined by a difference between an adjustment feedback signal and an adjustment reference signal, wherein the adjustment feedback signal is correlated with the output signal;
wherein the driving signal is determined by a drain-source voltage of the adjustment transistor and a voltage across the impedance adjustment device, wherein the voltage across the impedance adjustment device is determined by a product of the resistance of the impedance adjustment device multiplied by the differential current of the front stage amplification signal.

18. The regulator circuit of claim 17, wherein a bias value lies between an adjustment target value of the output adjustment circuit and an output target value of the front stage amplification circuit, so that when the output signal exceeds the output target value by a difference which is greater than the bias value, the output adjustment circuit controls the output transistor according to the adjustment target value, so that in a transient state, the output signal is regulated such that the output signal does not exceed a sum of output target value plus the bias value.

* * * * *